(12) United States Patent
Bajaj

(10) Patent No.: US 7,759,165 B1
(45) Date of Patent: Jul. 20, 2010

(54) NANOSPRING

(76) Inventor: Rajeev Bajaj, 43651 Skye Rd., Fremont, CA (US) 94539

( * ) Notice: Subject to any disclaimer, the term of this patent is extended or adjusted under 35 U.S.C. 154(b) by 0 days.

(21) Appl. No.: 12/395,681

(22) Filed: Mar. 1, 2009

(51) Int. Cl.
*H01L 21/00* (2006.01)

(52) U.S. Cl. ............... 438/113; 438/117; 438/751

(58) Field of Classification Search ............ None
See application file for complete search history.

(56) References Cited

U.S. PATENT DOCUMENTS

| | | | |
|---|---|---|---|
| 2003/0135971 A1* | 7/2003 | Liberman et al. | 29/419.1 |
| 2006/0290343 A1* | 12/2006 | Crafts et al. | 324/158.1 |
| 2008/0224327 A1* | 9/2008 | Suh et al. | 257/782 |
| 2009/0121732 A1* | 5/2009 | Crafts et al. | 324/757 |

* cited by examiner

*Primary Examiner*—Alonzo Chambliss
(74) *Attorney, Agent, or Firm*—Sonnenschein Nath & Rosenthal, LLP

(57) ABSTRACT

A nanospring is formed by first forming a stack of alternating layers of materials which have different susceptibilities to a selective etch solution. The stack is formed over a substrate and is subsequently etched with a substantially non-isotropic etch to create a via having substantially straight sidewalls. The sidewalls of the via are exposed to the selective etch solution, thereby creating irregular sidewalls of the via. A metal film is conformally deposited within the via, and, after excess metal is removed, the stack of alternating layers of materials is etched to expose remaining portions of the conformably deposited film, which comprise the nanospring.

24 Claims, 2 Drawing Sheets

NANOSPRING

FIELD OF THE INVENTION

The present invention relates to nanosprings and methods of fabricating nanosprings.

BACKGROUND

Modern integrated circuits (IC) are complex devices and it has become increasingly difficult to fabricate all of the required circuitry for such devices on a single die. As a result, complex circuits are often created from circuit components in two or more dies and the dies are connected together through electrical connections. One such connection technology is a so-called through-silicon via (TSV) which is a form of three dimensional (3D) interconnection between circuits in wafers or dies stacked on top of one another. U.S. Pat. No. 7,157,787 describes one such method of connecting stacked wafers or dies by making a face-to-face contact between the wafers/dies and creating thru vias to add additional stacked pairs.

In any 3D interconnect it is important to ensure good electrical contact between the components thereof. To effect reliable connections between contact elements (e.g., bonding pads) of two semiconductor dies, one must be concerned with several parameters including, but not limited to: alignment of the dies and contact pads, contact force, balanced contact force, contact resistance, and planarization. Wafer/die alignment and planarization (i.e., flatness) requirements pose serious challenges as wafers/dies are often warped during manufacturing process (e.g., due to different temperature profiles across the wafers/dies and the many different materials used therein). Complicating the problem, one must also take steps to ensure good ohmic contact is made between the circuits disposed on the individual wafers/dies.

U.S. Pat. No. 6,975,016 proposes the use of a flexible bladder behind a thinned wafer to address wafer/die flatness and enable good contact between two wafers prior to bonding. U.S. Pat. No. 5,884,398 describes a method of adding separately manufactured, resilient spring contacts onto the bond pads on the dies to provide electrical connections between two stacked dies. Adding such spring contacts allows for testing the dies before dicing the wafer.

SUMMARY OF THE INVENTION

A nanospring is formed by first forming a stack of alternating layers of materials which have different susceptibilities to a selective etch solution. The stack is formed over a substrate and is subsequently etched with a substantially non-isotropic etch to create a via having substantially straight sidewalls. The sidewalls of the via are exposed to the selective etch solution, thereby creating irregular sidewalls of the via. A metal film is conformally deposited within the via, and, after excess metal is removed, the stack of alternating layers of materials is etched to expose remaining portions of the conformably deposited film, which comprise the nanospring.

The thickness of a nanospring's walls will be determined by the shape and height of the bellows-like portion of the nanospring. For example, when 1 micron thick films are stacked together, the total thickness of film deposited has to be less than 0.5 micron to prevent the possibility of the bellows-like structure being completely filled by the deposited film. This condition should be avoided to maintain the resiliency of the nanospring.

Embodiments of the present nanosprings may involve conformally deposited films that are metals, such as copper, nickel or aluminum, or multi-layer metals. In some cases, multi-layer nanosprings may be fashioned by depositing a metal over a previously formed nanospring. Nanosprings fashioned in accordance with the present invention may have a full height of approximately 1-100 microns, and preferably 5-20 microns, and a compressed height of approximately 1-50 microns. Nanosprings fashioned in accordance with the present invention may have a diameter of approximately 0.5-25 microns, and preferably 1-5 microns.

Further embodiments of the invention provide for forming nanosprings on first electrical contact elements of a first integrated circuit structure embodied in a first die of a wafer containing more than one die; dicing the wafer into individual dies, the first die being one of the individual dies; placing the first die in proximity to a second die embodied in the wafer such that the first electrical contact elements of the first die are aligned with second electrical contact elements of a second electrical circuit structure embodied in the second die; pressing the first die against the wafer so that the nanosprings on the first electrical contact elements of the first integrated circuit structure embodied in the first die press against the second electrical contact elements of the second electrical circuit structure embodied in the second die forming an electrical contact between the first electrical contact elements and the second electrical contact elements. An adhesive layer may be added between the first and second dies and the first and second dies may be bonded by thermal bonding of copper surfaces of the nanosprings and curing of the adhesive layer.

Still further embodiments of the invention provide for forming nanosprings on first electrical contact elements of a first integrated circuit structure embodied in a first die embedded in a wafer containing more than one die; placing a second die in proximity to the first die embodied in the wafer such that the first electrical contact elements of the first die are aligned with second electrical contact elements of a second electrical circuit structure embodied in the second die; pressing the second die against the wafer so that the nanosprings on the first electrical contact elements of the first integrated circuit structure embodied in the first die press against the second electrical contact elements of the second electrical circuit structure embodied in the second die forming an electrical contact between the first electrical contact elements and the second electrical contact elements. An adhesive layer between the first and second dies and the first and second dies may be bonded by thermal bonding of copper surfaces of the nanosprings and curing of the adhesive layer.

Further embodiments of the invention are described in detail below.

BRIEF DESCRIPTION OF THE DRAWINGS

The present invention is illustrated by way of example, and not limitation, in the figures of the accompanying drawings, in which.

DETAILED DESCRIPTION

Figure 1A:
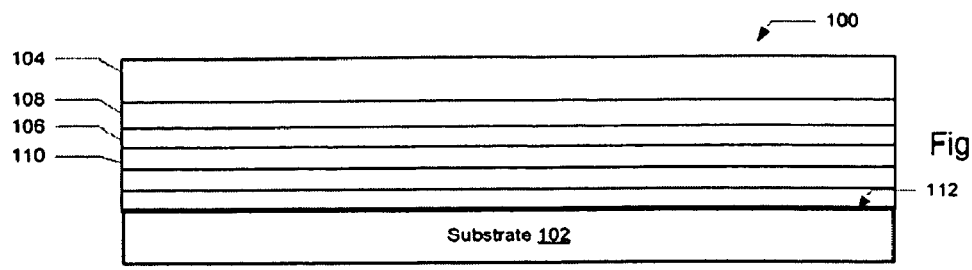
FIGS. 1(a)-1(e) illustrate selected portions of a process of forming a nanospring by first forming a stack of alternating layers of materials, etching the stack with a substantially non-isotropic etch to create a via having substantially straight sidewalls, exposing the via to a selective etch, thereby creating irregular sidewalls in the via, conformally depositing a film within the via, and, after excess film material is removed, etching the stack to expose remaining portions of the conformably deposited film, which comprises the nanospring, according to an embodiment of the invention.

Recognizing that certain advantages may be had as a result of the use of resilient contacts between bonding pads or other electrical connection elements of wafers/dies and electrical probes or connection elements of other wafers/dies, the preset inventor has developed novel methods of fashioning structures (called nanosprings) that provide resilient contact for electrical connection elements of wafers/dies and which address wafer/die non-planarity. In brief, nanosprings are fashioned on die/wafer electrical connection elements, such as bonding pads and the like, using conventional semiconductor fabrication techniques which have not heretofore been applied for such purposes. This method has significant advantages over other, proposed nanospring fabrication processes, as resilient contacts can now be made directly on the electrical connection elements, thereby eliminating the need to adhere separately manufactured nanosprings thereto.

Nanosprings made in accordance with the present methods can be much smaller in size than separately manufactured nanosprings, and can be precisely sized to the contact area of the subject electrical connection element(s) to which they are electrically connected. Indeed, where desirable or necessary, multiple individual nanosprings can be made on a single electrical connection element (such as a bonding pad of a die/wafer), to ensure reliable contact with a counterpart electrical connection element of another die/wafer or a tip of an electrical probe associated with test/measurement equipment. Resiliency and compliance of nanosprings fashioned in accordance with the present invention can be adjusted by modulating the height and profile of the nanosprings, which parameters may be controlled using well-understood semiconductor fabrication processes.

One procedure for making nanosprings in accordance with the present invention involves depositing a dielectric stack on a top surface of a wafer, after bonding pads or other electrical connection elements have been formed thereon. The dielectric stack may consist of films of two (or more) materials, in some instances dielectrics, for example silicon dioxide and silicon nitride, or silicon nitride and polysilicon, deposited in alternating layers. Alternatively, The individual layers have thicknesses chosen to provide a desired nanospring profile (as discussed below) and the overall height of the stack may be several layers thick (e.g., the stack may include a total of 4-5 layers, though in some instances more or fewer, e.g., as few as 2 or as many as 10 or more, layers may be used). The materials selected for use as the layers of the stack should exhibit different susceptibilities to a selective etch solution that is employed in fabrication of the nanospring, as discussed below.

Using conventional lithography techniques, at least one opening in the stack is made over a corresponding electrical connection element of the wafer/die using a non-selective etch process (e.g., a wet etch or a plasma etch) so that the sidewalls of the opening are straight. The stack is then subjected to a selective etch (e.g., using an HF solution in the case of a stack formed of silicon dioxide and silicon nitride layers), so that one of the films in the stack is undercut, thereby creating irregular sidewall in the overall opening. The irregular profile resembles that of a threaded nut, with the exception that the "threads" are all approximately parallel to one another, rather than forming a spiral about a central axis. The thickness of the individual threads is determined by the thicknesses of the individual layers of the stack, and there is no requirement that these layers be of uniform thickness. That is, each layer in the dielectric stack may have a unique thickness, all of the layers may have the same thickness, or varying ones of the layers may have a common thickness while others have unique thicknesses.

Once the etch has been completed, a conformal metal film is deposited in the opening. The dielectric film stack is then removed to expose a bellows-like structure (the deposited metal film left behind after the etch) capable of acting like a spring—i.e., a nanospring. This nanospring resembles, in profile, a threaded bolt, wherein the "threads" are complementary to those of the irregular profile formed by the selective etch of the dielectric stack. Any suitable method that is capable of conformal deposition can be used to deposit material for nanospring, for example electroless plating, chemical vapor deposition, atomic layer deposition, etc.

The present nanosprings can be fabricated using conventional IC fabrication techniques. Nanosprings having cross-sectional dimensions on the order of fifty microns or less can be made with this process. This ability to manufacture nanosprings having such small dimensions addresses the evolving needs of interconnection technologies for wafer-level testing and 3D interconnections.

The present nanosprings may be made from gold, aluminum, copper, tungsten and/or alloys of these materials. Typically, such materials are alloyed with small amounts of other metals (such as beryllium, cadmium, silicon, magnesium, and the like) to obtain desired physical properties. It is also possible to use silver, palladium or platinum, or alloys of such metals as nanosprings. Also, solder constituted from lead, tin, indium, bismuth, cadmium, antimony and/or their alloys can also be used to form nanosprings in accordance with the present invention.

FIG. 1(a) illustrates a dielectric film stack 100, made up of alternating layers of two films, atop a wafer substrate 102. The layers of the stack may be created by depositing the films (using any of the above-described techniques) in alternating sequence. In this example, layers 104 and 106 are composed of a first material, and layers 108 and 110 are composed of a second, different material. In one embodiment the first material is silicon dioxide and the second material is silicon nitride, though in other embodiments different materials may be used. The wafer substrate 102 may be a finished wafer, having electrical connection elements (e.g., bonding pads) (not shown) fashioned on a top surface 112 thereof.

Figure 1B:
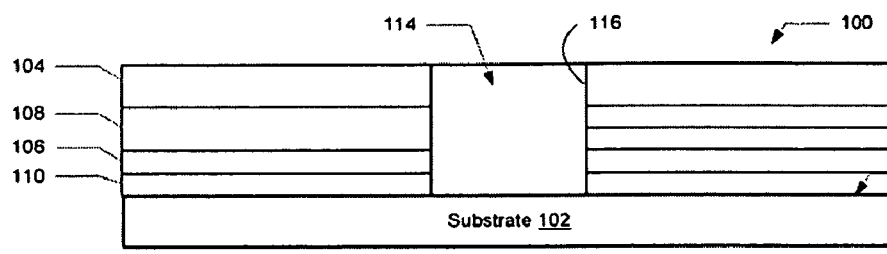

FIG. 1(b) shows the dielectric stack 100 after a via 114 has been etched into the stack. The sidewalls 116 of the via are straight (or approximately so). The via 114 is etched through all of the layers of the stack 100, and exposes the surface of the wafer substrate 112 thereunder. In practice, this will expose a bonding pad or other electrical connection element at this location and the via location will have been selected (e.g., using an appropriate photolithographic masking process) to ensure same.

Figure 1C:
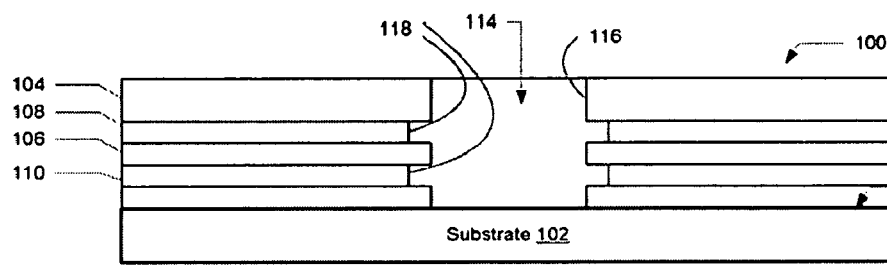

FIG. 1(c) shows the stack after it has been exposed to a selective etching solution. In this example, layers 108 and 110 have been selectively etched to create undercuts 118 in the via's sidewalls 116, creating a bellows-like structure along the height of the via.

Figure 1D:
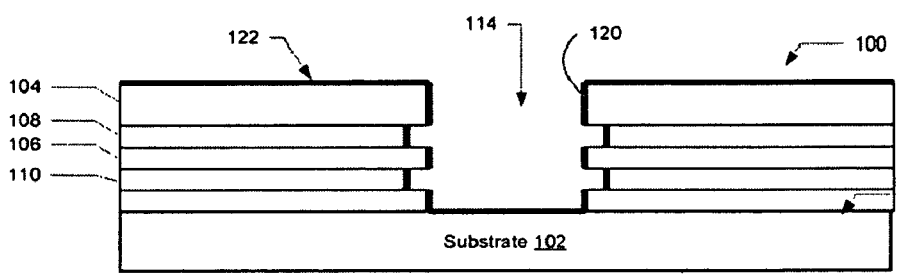
Figure 1E:
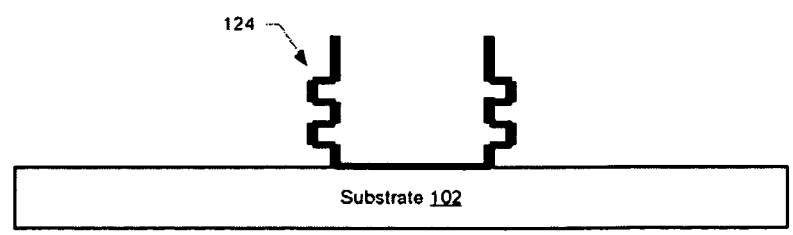
Figure 2A:
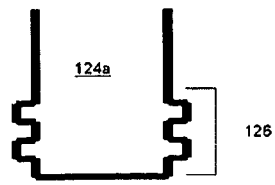
FIGS. 2(a)-2(f) illustrate various profiles of nanospring structure that may be created in accordance with embodiments of the present invention.
Figure 2B:
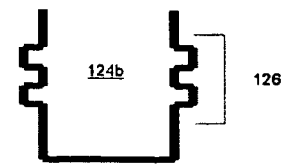
Figure 2C:
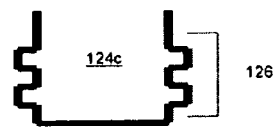
Figure 2D:
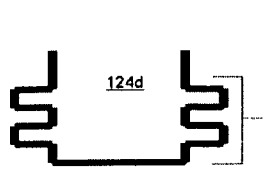
Figure 2E:
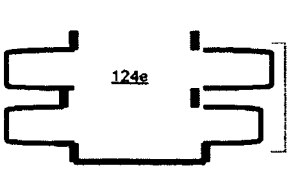
Figure 2F:
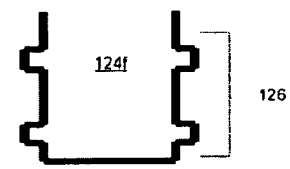

Referring now to FIG. 1(d), a conformal deposition of the metal film 120 follows the contours of the sidewalls 116, 118. In one embodiment, the deposition may include a conformal, electroless copper film followed by an electroplated copper film. That portion of the conformal metal film that is deposited on the top surface 122 of the stack 100 is removed, for example by chemical mechanical planarization (CMP), or another suitable process, and the dielectric stack 100 is then etched by a plasma or suitable wet process, leaving behind the nanospring structure 124 disposed atop the wafer substrate (i.e., the bonding pad or other electrical connection element thereof), as shown in FIG. 1(e).

FIGS. 2(a)-2(f) show various profiles of nanospring structures 124a-124f that may be created using the present fabrication techniques. Of course, these are only a small sampling of the numerous forms that may be created and are not meant to be an exhaustive illustration thereof. The compressible, bellows-like part 126 of the nanospring may be spread uniformly over the length of the structure, or may be limited to a top or bottom portion of the nanospring. By varying the number and thicknesses of the layers that make up the dielectric stack, bellows-like portions of almost any size, pitch, depth, and pitch diameter can be fashioned. Through lithography, the diameter of the nanospring can be controlled. The final shape of the bellows-like section 126 is controlled by the selective wet etch step that creates the undercut in one of the layer materials that make up the dielectric stack.

Figure 3A:
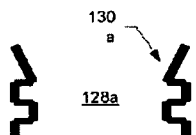
FIGS. 3(a)-3(b) shows nanosprings with tapered tops in accordance with embodiments of the present invention.
Figure 3B:

FIGS. 3(a) and 3(b) show nanosprings 128a and 128b having tapered tops 130a and 130b, respectively. This attribute of a nanospring may be an important element in making good electrical contact with an electrical contact element of a wafer/die other than the one on which the nanospring was fashioned, or with a probe, as it allows the top of the nanospring to be displaced laterally across the surface of such an electrical contact element while undergoing compression.

Figure 4:
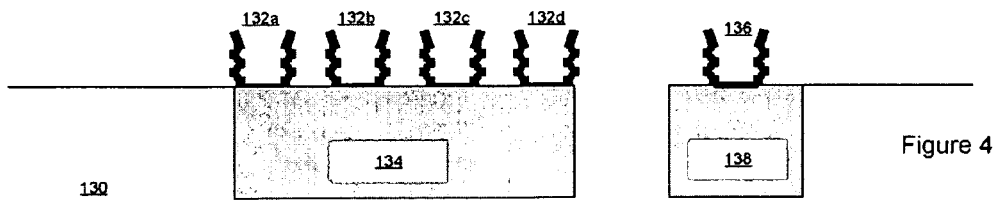
FIG. 4 shows an IC structure containing multiple nanosprings in accordance with embodiments of the present invention.

FIG. 4 shows an IC structure 130 (e.g., a wafer or die) containing multiple nanosprings, 132a-132d, formed on a single electrical contact element (e.g., a bonding pad) 134, and a single nanospring 136, formed on a separate electrical contact element 138. It is possible to create number of nanosprings on a single, relatively large, bonding pad (or other electrical contact element of an IC structure) to ensure good electrical contact to a complementary electrical contact element of another wafer/die, and to also provide an adequate number of conductors to carry a required current. The size and pitch of a group of such nanosprings associated with a single electrical contact element can be tailored to meet compliance and contact requirements. A relatively small electrical contact element may require only one nanospring while a relatively large electrical contact element may utilize multiple nanosprings.

Figure 5:
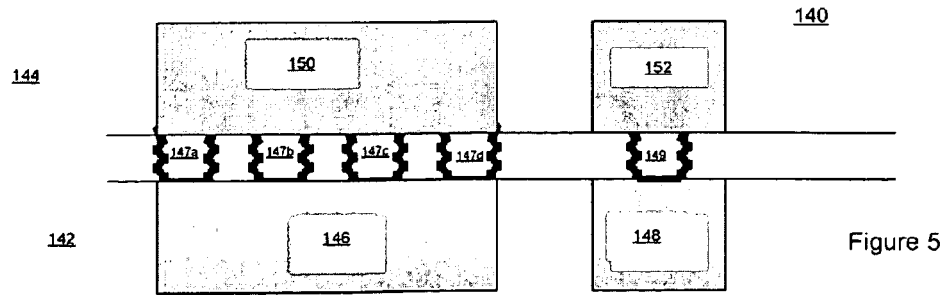
FIG. 5 shows a bonded IC structure containing nanosprings in accordance with embodiments of the present invention.

FIG. 5 shows an IC structure 140, made up of two wafers/dies 142 and 144. Wafer/die 142 includes electrical contact elements 146 and 148, each with associated, respective nanosprings 147a-147d and 149. Nanosprings 147a-147d are in electrical connection with electrical contact element 150 of wafer/die 144, and nanospring 149 is in electrical connection with electrical contact element 152 of wafer/die 144. Thus, the complementary electrical contact elements of the two wafers/dies 142, 144 are electrically connected to one another through the respective nanosprings. As the two wafers/dies 142, 144 are pressed close together (e.g., during manufacture of the IC structure 140), it can be expected that the nanosprings will maintain and facilitate good electrical contact between the respective electrical contact elements of the wafers/dies, even in the presence of wafer/die non-planarity.

While nanosprings can be made in any dimension and aspect ratio, there are some factors in the design of the nanosprings that deserve consideration when seeking to achieve desired compliance benefits. For example, the total height of a nanospring and its desired compressibility will influence the number of bellows-like structures that should be employed, and, hence the number of layers in the dielectric stack, the thickness of those layers and the thickness of the nanospring walls. If a nanospring needs to have a height of 5 microns, it might be useful to deposit a stack consisting of five alternating, 1 micron thick, layers of silicon dioxide and silicon nitride.

Further, recall that after a plasma etch produces a via in the dielectric stack, the structure is exposed to a selective etch solution. The time of the etch will be an important factor in determining the final shape of the bellows-like portion of the nanospring. A short or nominal etch time might provide a structure such as that illustrated for nanospring 124a in FIG. 2(c), while longer etch times may yield a structure similar to nanospring 124d in FIG. 2(d). Depending on the individual dielectric stack layer thicknesses, any type of structure can be created.

Thus, by varying the thicknesses of the dielectric stack layers and the wet etch times employed, one can create nanosprings having may different profiles. It may be preferable to adjust the wet etch times so that the depth of the etch (relative to the via sidewall formed by the un-etched film) is equal to a depth between approximately one-half the thickness of the etched film to approximately the thickness of the etched film. Significant etch beyond this region will likely not improve the compressibility of the bellows-like portion of the nanospring, but will reduce the density of nanosprings that can be formed. Plasma etch profiles can also be used to affect the shape of the nanospring.

A tapered structure, such as that shown in FIGS. 3(a) and 3(b) can be readily made using proper etch process conditions. The taper has the added benefit of facilitating good ohmic contact as the electrical contact element containing the nanospring is brought in contact with another such contact element of another wafer/die. The taper creates an opportunity for sliding contact, ensuring good electrical contact.

An optional step, as shown in FIG. 3(b), may be added to the nanospring fabrication procedure to facilitate production of a surface 154 at the top edge of the tapered portion of the nanospring. Such a surface may be created using appropriate photolithographic processes when the dielectric stack is removed. The surface 154 provides a large contact area for an electrical contact element of another wafer/die.

The thickness of a nanospring's walls will be determined by the shape and height of the bellows-like portion of the nanospring. For example, when 1 micron thick films are stacked together, the total thickness of film deposited has to be less than 0.5 micron to prevent the possibility of the bellows-like structure being completely filled by the deposited film. This condition should be avoided to maintain the resiliency of the nanospring.

Embodiments of the present nanosprings may involve conformally deposited films that are metals, such as nickel or aluminum, or multi-layer metals. In some cases, multi-layer nanosprings may be fashioned by depositing a metal over a previously formed nanospring. Nanosprings fashioned in accordance with the present invention may have a full height of approximately 1-100 microns, and preferably 5-20 microns, and a compressed height of approximately 1-50 microns. Nanosprings fashioned in accordance with the present invention may have a diameter of approximately 0.5-25 microns, and preferably 1-5 microns.

Further embodiments of the invention provide for forming nanosprings on first electrical contact elements of a first integrated circuit structure embodied in a first die of a wafer containing more than one die; dicing the wafer into individual dies, the first die being one of the individual dies; placing the first die in proximity to a second die embodied in the wafer such that the first electrical contact elements of the first die are aligned with second electrical contact elements of a second electrical circuit structure embodied in the second die; pressing the first die against the wafer so that the nanosprings on the first electrical contact elements of the first integrated circuit structure embodied in the first die press against the second electrical contact elements of the second electrical circuit structure embodied in the second die forming an electrical contact between the first electrical contact elements and the second electrical contact elements. An adhesive layer may be added between the first and second dies and the first and second dies may be bonded by thermal bonding of copper surfaces of the nanosprings and curing of the adhesive layer.

Still further embodiments of the invention provide for forming nanosprings on first electrical contact elements of a first integrated circuit structure embodied in a first die embedded in a wafer containing more than one die; placing a second die in proximity to the first die embodied in the wafer such that the first electrical contact elements of the first die are aligned with second electrical contact elements of a second electrical circuit structure embodied in the second die; pressing the second die against the wafer so that the nanosprings on the first electrical contact elements of the first integrated circuit structure embodied in the first die press against the second electrical contact elements of the second electrical circuit structure embodied in the second die forming an electrical contact between the first electrical contact elements and the second electrical contact elements. An adhesive layer between the first and second dies and the first and second dies may be bonded by thermal bonding of copper surfaces of the nanosprings and curing of the adhesive layer.

In the forgoing description, several illustrated embodiments of the invention have been presented. However, these examples are not intended to limit the scope of the invention. Instead, the invention should be measured only in terms of the claims, which follow.

What is claimed is:

1. A method of forming a nanospring, comprising:
   forming a stack of alternating layers of materials, the materials having different susceptibilities to a selective etch solution, the stack being formed over a substrate;
   etching the stack of alternating layers of materials with a substantially non-isotropic etch to create a via having substantially straight sidewalls;
   exposing the sidewalls of the via to the selective etch solution thereby etching those of the layers of the stack which are susceptible to the selective etch solution and creating irregular sidewalls of the via;
   conformally depositing a film within the via;
   removing the conformally deposited film from areas of the stack of alternating layers of materials outside of the via; and
   etching the stack of alternating layers of materials to expose remaining portions of the conformably deposited film, said remaining portions comprising the nanospring.

2. The method of claim 1, wherein the materials comprising the stack of alternating layers are dielectrics.

3. The method of claim 1, wherein one of the materials comprising the stack of alternating layers is silicon nitride and another of the materials comprising the stack of alternating layers is silicon dioxide.

4. The method of claim 1, wherein one of the materials comprising the stack of alternating layers is silicon nitride and another of the materials comprising the stack of alternating layers is polysilicon.

5. The method of claim 1, wherein the conformally deposited film is nickel.

6. The method of claim 1, wherein the conformally deposited film is aluminum.

7. The method of claim 1, wherein the conformally deposited film is a multi-layer metal.

8. The method of claim 1, wherein the conformally deposited film is a metal.

9. The method of claim 1, wherein the nanospring has a height of approximately 1-100 microns.

10. The method of claim 1, wherein the nanospring has a height of approximately 5-20 microns.

11. The method of claim 1, wherein the nanospring has a diameter of approximately 0.5-25 microns.

12. The method of claim 1, wherein the nanospring has a diameter of approximately 1-5 microns.

13. The method of claim 1, wherein the nanospring has a compressed height of approximately 1-50 microns.

14. The method of claim 1, wherein one end of the nanospring is tapered.

15. A method of making nanosprings, comprising:
    depositing alternating layers of silicon dioxide and silicon nitride over a substrate;
    etching one or more holes into a stack comprising the alternating layers of silicon dioxide and silicon nitride using a plasma etch process thereby creating a cavity with substantially uniform sidewalls;
    selecting etching the sidewalls of the cavity using an HF solution thereby creating recesses in the stack of alternating layers;
    depositing a conformal, electroless copper film followed by an electroplated copper film;
    removing copper from a top surface of the stack; and
    etching the silicon dioxide and silicon nitride using a plasma etch process to expose copper nanosprings.

16. A method, comprising:
    forming nanosprings on first electrical contact elements of a first integrated circuit structure embodied in a first wafer containing more than one die;
    placing a second wafer in proximity to the first wafer such that the first electrical contact elements of the first wafer are aligned with second electrical contact elements of a second electrical circuit structure embodied in the second wafer;
    pressing the first and second wafers together so that the nanosprings on the first electrical contact elements of the first integrated circuit structure embodied in the first wafer press against the second electrical contact elements of the second electrical circuit structure embodied in the second wafer forming an electrical contact between the first electrical contact elements and the second electrical contact elements.

17. The method of claim 16, further comprising adding an adhesive layer between the first and second wafers.

18. The method of claim 17, further comprising bonding the first and second wafers by thermal bonding of copper surfaces of the nanosprings and curing of the adhesive layer.

19. A method, comprising:
    forming nanosprings on first electrical contact elements of a first integrated circuit structure embodied in a first die of a wafer containing more than one die;
    dicing the wafer into individual dies, the first die being one of the individual dies;

placing the first die in proximity to a second die embodied in the wafer such that the first electrical contact elements of the first die are aligned with second electrical contact elements of a second electrical circuit structure embodied in the second die;

pressing the first die against the wafer so that the nanosprings on the first electrical contact elements of the first integrated circuit structure embodied in the first die press against the second electrical contact elements of the second electrical circuit structure embodied in the second die forming an electrical contact between the first electrical contact elements and the second electrical contact elements.

20. The method of claim 19, further comprising adding an adhesive layer between the first and second dies.

21. The method of claim 20, further comprising bonding the first and second dies by thermal bonding of copper surfaces of the nanosprings and curing of the adhesive layer.

22. A method, comprising:

forming nanosprings on first electrical contact elements of a first integrated circuit structure embodied in a first die embedded in a wafer containing more than one die;

placing a second die in proximity to the first die embodied in the wafer such that the first electrical contact elements of the first die are aligned with second electrical contact elements of a second electrical circuit structure embodied in the second die;

pressing the second die against the wafer so that the nanosprings on the first electrical contact elements of the first integrated circuit structure embodied in the first die press against the second electrical contact elements of the second electrical circuit structure embodied in the second die forming an electrical contact between the first electrical contact elements and the second electrical contact elements.

23. The method of claim 22, further comprising adding an adhesive layer between the first and second dies.

24. The method of claim 23, further comprising bonding the first and second dies by thermal bonding of copper surfaces of the nanosprings and curing of the adhesive layer.

* * * * *